(12) United States Patent
Han

(10) Patent No.: US 8,836,054 B2
(45) Date of Patent: Sep. 16, 2014

(54) SEMICONDUCTOR CHIP CAPABLE OF IMPROVING MOUNTING RELIABILITY AND SEMICONDUCTOR PACKAGE HAVING THE SAME

(75) Inventor: Kwon Whan Han, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 271 days.

(21) Appl. No.: 13/243,681

(22) Filed: Sep. 23, 2011

(65) Prior Publication Data

US 2012/0153410 A1 Jun. 21, 2012

(30) Foreign Application Priority Data

Dec. 17, 2010 (KR) ........................ 10-2010-0129868

(51) Int. Cl.
*G01P 15/08* (2006.01)
*H01L 23/00* (2006.01)

(52) U.S. Cl.
CPC ....... *H01L 24/17* (2013.01); *H01L 2924/00015* (2013.01); *H01L 2924/3512* (2013.01); *H01L 24/81* (2013.01); *H01L 2224/14515* (2013.01); *H01L 2224/81007* (2013.01); *H01L 24/13* (2013.01); *H01L 24/16* (2013.01); *H01L 2224/10122* (2013.01); *H01L 24/14* (2013.01); *H01L 2224/131* (2013.01); *H01L 2224/16227* (2013.01); *H01L 2224/81191* (2013.01)

USPC ........................... 257/417; 257/418; 324/699

(58) Field of Classification Search
CPC ..................... F25B 2400/15; H01H 2057/006; H01L 41/1132
USPC .................................. 324/699; 257/417, 418
See application file for complete search history.

(56) References Cited

U.S. PATENT DOCUMENTS

2004/0189141 A1* 9/2004 Tavkhelidze et al. ......... 310/306
2008/0251939 A1* 10/2008 Chung et al. .................. 257/777
2011/0050262 A1* 3/2011 Chen et al. ............... 324/754.27

FOREIGN PATENT DOCUMENTS

| JP | 2000-114918 A | 4/2000 |
|---|---|---|
| KR | 10-2002-0057699 A | 7/2001 |
| KR | 10-2002-0057351 A | 7/2002 |

* cited by examiner

*Primary Examiner* — Anthony Ho
*Assistant Examiner* — David Chen
(74) *Attorney, Agent, or Firm* — William Park & Associates Patent Ltd.

(57) ABSTRACT

A semiconductor chip includes a semiconductor chip body having a first surface and a second surface that faces away from the first surface, and including a plurality of bonding pads disposed on the first surface. Also, the semiconductor chip includes a distance maintaining member attached to the first surface of the semiconductor chip body and electrically connected with a circuit pattern.

8 Claims, 2 Drawing Sheets

SEMICONDUCTOR CHIP CAPABLE OF IMPROVING MOUNTING RELIABILITY AND SEMICONDUCTOR PACKAGE HAVING THE SAME

CROSS-REFERENCE TO RELATED APPLICATIONS

The present application claims priority to Korean patent application number 10-2010-0129868 filed on Dec. 17, 2010, which is incorporated herein by reference in its entirety.

BACKGROUND OF THE INVENTION

The present invention relates to a semiconductor package, and more particularly to a semiconductor chip with improved mounting reliability and a semiconductor package having the same.

A flip chip package using bumps has been suggested to shorten electrical signal transfer paths between a semiconductor chip and a printed circuit board.

The flip chip package has a structure in which a semiconductor chip is physically attached to and at the same time is electrically connected with a printed circuit board by bumps formed on bonding pads of the semiconductor chip. The flip chip package provides advantages in that, since electrical connections between the semiconductor chip and the printed circuit board are formed only by the bumps, signal transfer paths are short and excellent electrical characteristics can be obtained.

However, the flip chip package encounters problems in that moisture is likely to leak to the connections and a stress is continuously applied to the connections due to a difference in CTE (coefficient of thermal expansion) between the semiconductor chip and the printed circuit board. Accordingly, fatigue fracture may frequently occur in these connections.

Currently, in order to solve these problems, an underfill process for filling the space between a semiconductor chip and a printed circuit board with a gap-fill substance is performed. However, the underfill process causes other problems in that it is difficult to control processing and voids are likely to be produced in the gap-fill substance.

Moreover, in the case where the underfill process is adopted, wetting may not be properly implemented in a subsequent process. This may deteriorate processing stability and workability, thereby degrading the reliability and productivity of a flip chip package.

In place of adopting the underfill process of filling the space with the gap-fill substance, a method has been proposed in which a semiconductor chip is attached after forming a film or a non-conductive adhesive (NCA) on a printed circuit board. In this method, the production of voids is lessened when compared to the underfill process.

Nevertheless, in the event that the thickness of the film or the non-conductive adhesive is substantial, bumps of a semiconductor chip and a printed circuit board are likely to be improperly connected due to the substantial thickness of the film or the non-conductive adhesive, and a problem may result when transmitting electrical signals.

BRIEF SUMMARY OF THE INVENTION

An embodiment of the present invention is directed to a semiconductor chip capable of improving mounting reliability.

Also, an embodiment of the present invention is directed to a semiconductor package having a semiconductor chip capable of improving mounting reliability.

In an embodiment of the present invention, a semiconductor chip includes a semiconductor chip body having a first surface and a second surface that faces away from the first surface, and including a plurality of bonding pads disposed on the first surface; and a distance maintaining member attached to the first surface of the semiconductor chip body and electrically connected with a circuit pattern.

The circuit pattern is formed in the semiconductor chip body and may include a circuitry for inverting and amplifying an input voltage.

The distance maintaining member may include: a sensing element configured to sense distance between the first surface of the semiconductor chip body and a surface on which the semiconductor chip body is placed; and compensating elements configured to appropriately maintain the distance.

The compensating elements may be disposed at positions adjacent to the sensing element.

Within the distance maintaining member, a number of the compensating elements may be greater than a number of the sensing elements.

The sensing element may include a first piezoelectric element configured to generate a first level signal to communicate to the circuit pattern, wherein the first level signal is generated according to a first stress applied to the first piezoelectric element; and the compensating elements may include second piezoelectric elements configured to receive a second level signal from the circuit pattern based on the first signal level.

The first level signal and the second level signal may have opposite polarities and substantially the same magnitude.

At least one distance maintaining member may be attached to the first surface of the semiconductor chip body.

The semiconductor chip may further include connection members attached to the bonding pads.

The connection members may have the substantially the same height as the distance maintaining member formed on the first surface of the semiconductor chip body.

In another embodiment of the present invention, a semiconductor package includes: a semiconductor chip including a semiconductor chip body having a first surface and a second surface that faces away from the first surface, and including a plurality of bonding pads disposed on the first surface, and a distance maintaining member attached to the first surface of the semiconductor chip body and electrically connected with a circuit pattern; and a substrate having an upper surface, on which the semiconductor chip is mounted and is brought into contact with the distance maintaining member, and a lower surface that faces away from the upper surface.

The circuit pattern is formed in the semiconductor chip body and may include a circuitry for inverting and amplifying an input voltage.

The distance maintaining member may include a sensing element configured to sense distance between the first surface of the semiconductor chip body and the upper surface of the substrate, and compensating elements configured to appropriately maintain the space.

The compensating elements may be disposed at positions adjacent to the sensing element.

Within the distance maintaining member, a number of the compensating elements may be greater than a number of the sensing elements.

The sensing element may include a first piezoelectric element that is configured to generate a first level signal to communicate to the circuit pattern, wherein the first level signal is generated according to a first stress applied to the first piezoelectric element; and the compensating elements may include second piezoelectric elements configured to receive a second level signal generated by the circuit pattern based on the first level signal.

The first level signal and the second level signal may have opposite polarities and substantially the same magnitude.

At least one distance maintaining member may be attached to the first surface of the semiconductor chip body.

The semiconductor package may further include connection members electrically connecting the bonding pads with at least a portion of the substrate.

The connection members may have substantially the same height as the distance maintaining member which is formed on the first surface of the semiconductor chip body.

DESCRIPTION OF SPECIFIC EMBODIMENTS

Hereafter, specific embodiments of the present invention will be described in detail with reference to the accompanying drawings. These exemplary embodiments of the invention are described with the understanding that the invention is not limited to these embodiments.

It is to be understood herein that the drawings are not necessarily to scale and in some instances proportions may have been exaggerated in order to more clearly depict certain features of the invention.

Figure 1:
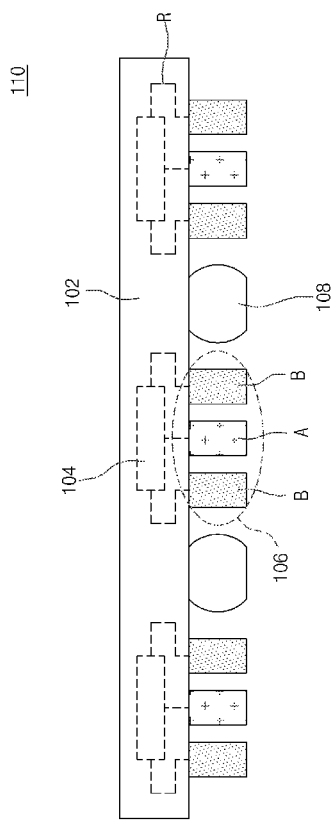
FIG. 1 is a cross-sectional view illustrating a semiconductor chip in accordance with an embodiment of the present invention.

FIG. 1 is a cross-sectional view illustrating a semiconductor chip in accordance with an embodiment of the present invention.

Referring to FIG. 1, a semiconductor chip 110 in accordance with an embodiment of the present invention includes a semiconductor chip body 102, circuit patterns 104, connection members 108, and distance maintaining members 106.

The semiconductor chip body 102 may possess, for example, a rectangular hexahedral shape with a top surface and a bottom surface, with a plurality of bonding pads (not shown) disposed on the bottom surface.

Each circuit pattern 104 is formed in the semiconductor chip body 102 and may include a circuitry for inverting and amplifying an input voltage. One or more circuit patterns 104 may be formed in the semiconductor chip body 102. While not shown in a drawing, the circuit patterns 104 may be disposed outside the semiconductor chip body 102.

The distance maintaining members 106 are attached to the bottom surface of the semiconductor chip body 102 to project from the bottom surface and are electrically connected with the circuit patterns 104. The circuit patterns 104 and the distance maintaining members 106 are electrically connected with each other by circuit wiring lines R.

Each distance maintaining member 106 serves as a component that functions to maintain a space between the bottom surface of the semiconductor chip body 102 and an object on which the semiconductor chip body 102 is to be placed. The distance maintaining member 106 includes a sensing element A for sensing space and compensating elements B for compensating for the space. The compensating elements B are disposed adjacent to the sensing element A. For example, there may be twice as many compensating elements B as the sensing elements A.

The sensing element A and the compensating elements B include, for example, piezoelectric elements. As is generally known in the art, a piezoelectric element has a characteristic where voltage is generated proportionally to applied stress. The reverse is also true. Thus, the piezoelectric element has a characteristic that a physical displacement such as contraction or expansion in volume occurs depending upon an applied voltage.

In an embodiment of the present invention, the sensing element A includes a first piezoelectric element that generates a first level signal depending upon a first stress applied to the first piezoelectric element, and transmits the first level signal to a corresponding circuit pattern 104, which processes the first level signal to output a second level signal. The compensating elements B include second piezoelectric elements that change its shape according to the second level signal from the circuit pattern 104. The first level signal and the second level signal may have appropriate correlation so that the magnitude of the first level signal generates the second level signal that will allow the second piezoelectric elements of the compensating elements B to relieve stress in the first piezoelectric element of the sensing element A.

For example, each circuit pattern 104 may function to apply the second level voltage to the second piezoelectric elements of the compensating elements B so that its volume changes by the same magnitude as the first piezoelectric element for the sensing element A. The embodiments for the circuit pattern 104 may depend on the piezoelectric materials used for the sensing elements A and the compensating elements B.

It is illustrated that the circuit patterns 104 are formed in the semiconductor chip body 102. However, while not shown in a drawing, it is conceivable that the circuit patterns 104 may be disposed outside the semiconductor chip body 102. An exemplary circuit pattern 104 for generating a second level signal that is of opposite polarity as the first level signal may include an amplifying circuit and an inverting circuit that are electrically connected with the sensing element A and the compensating elements B. While it is generally described as two separate circuits—amplifying and inverting—the circuit pattern 104 may comprise, for example, a single circuit that amplifies and inverts.

The connection members 108 are attached to the bonding pads, and include, for example, bumps such as solder bumps and stud bumps.

Figure 2:
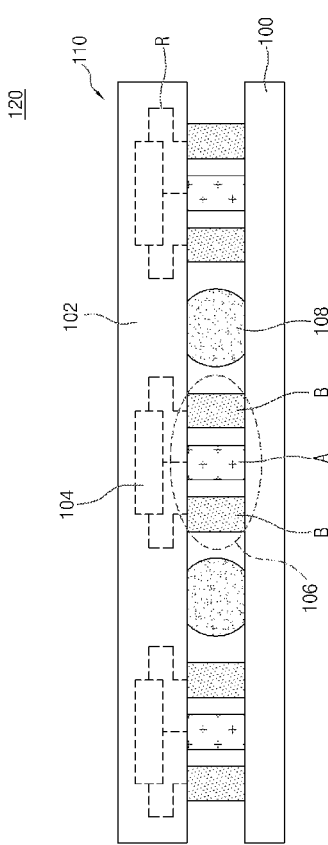
FIG. 2 is a cross-sectional view illustrating a semiconductor package in accordance with another embodiment of the present invention.

FIG. 2 is a cross-sectional view illustrating a semiconductor package with the structure of a flip chip package in accordance with another embodiment of the present invention.

Referring to FIG. 2, a semiconductor package 120 in accordance with another embodiment of the present invention includes a substrate 100 and a semiconductor chip 110 mounted onto the substrate 100.

The substrate 100 may be, for example, a printed circuit board (PCB). The substrate 100 has an upper surface and a lower surface. While not shown, the substrate 100 may include a plurality of bond fingers disposed on the upper surface, a plurality of ball lands disposed on the lower surface, and a plurality of via patterns disposed in the substrate to electrically connect the bond fingers and the ball lands in, for example, one-to-one correspondence.

In the same manner as shown in FIG. 1, the semiconductor chip 110 includes a semiconductor chip body 102, circuit patterns 104, connection members 108, and distance maintaining members 106. The semiconductor chip 110 is placed on the upper surface of the substrate 100 in a face-down type and is mounted to the upper surface of the substrate 100 by the connection members 108.

The semiconductor chip body 102 has a top surface and a bottom surface, and includes a plurality of bonding pads (not shown) disposed on the bottom surface. Each circuit pattern 104 is formed in the semiconductor chip body 102 and receives a first level signal and outputs a second level signal corresponding to the first level signal. The connection members 108 are formed on the bonding pads disposed on the bottom surface of the semiconductor chip body 102, and include, for example, bumps. Accordingly, the bonding pads of the semiconductor chip 110 and the bond fingers of the substrate 100 are electrically connected with each other by the connection members 108.

Each distance maintaining member 106 includes a sensing element A and compensating elements B both of which are electrically connected with a corresponding circuit pattern 104. The sensing elements A and the compensating elements B may have the same height as the connection members 108. Thus, as the semiconductor chip 110 is mounted to the upper surface of the substrate 100 by the connection members 108, the sensing element A and the compensating elements B of the distance maintaining member 106 are brought into contact with the upper surface of the substrate 100.

At least one of the circuit pattern 104 and the distance maintaining member 106 may be interposed between the substrate 100 and the semiconductor chip 110. The circuit patterns 104 may be disposed inside or outside the semiconductor chip 110.

While not shown, the semiconductor package 120 in accordance with an embodiment of the present invention may further include an encapsulation member that seals the upper surface of the substrate 100 including the semiconductor chip 110 and external connection terminals (not shown) attached to the lower surface of the substrate 100 that serve as mounting means to an outside circuit.

In the semiconductor package 120 in accordance with another embodiment of the present invention, a space between the substrate 100 and the semiconductor chip 110 is maintained by the actions of the sensing element A and the compensating elements B, by which reliability of joints can be improved.

As described above, the distance maintaining member 106 is interposed between the substrate 100 and the semiconductor chip 110. The distance maintaining member 106 includes the sensing element A and the compensating elements B. The sensing element A and the compensating elements B are electrically connected with the circuit pattern 104 formed in the semiconductor chip 110 by circuit wiring lines R.

The sensing element A and the compensating elements B include, for example, piezoelectric elements. A piezoelectric element has a characteristic that its volume increases or decreases depending in reaction to an applied voltage. Conversely, the piezoelectric element generates a voltage proportionally to increase or decrease of its volume due to an external force. In an embodiment of the invention, when the piezoelectric element for the sensing element A generates a voltage due to tensile stress, the piezoelectric elements for the compensating elements B are supplied with a voltage for compressive stress. That is, as the sensing element A is stretched, the compensating elements B are induced to contract to reduce the stretching of the sensing element A. Similarly, if the sensing element A is compressed, the compensating elements B are induced to stretch to reduce the compression of the sensing element A.

Therefore, the distance maintaining member 106 can maintain the space between the substrate 100 and the semiconductor chip 110, by using the first level signal from the sensing element A to appropriately control the shape of the compensating elements B.

For example, if tensile stress is induced on the sensing element A, the first level signal generated by the sensing element A is appropriately processed by the circuit pattern 104 to output a second level signal that is applied to the compensating elements B. The compensating elements B contract due to the applied second level signal compensate for the tensile stress on the sensing element A.

Thus, if the compensating elements B are caused to contract, the tensile stress applied to the sensing element A is decreased. Accordingly, the first level signal applied to the circuit pattern 104 is decreased, and the compressive stress applied to the compensating elements B is also decreased. As a result, equilibrium is reached near an initially designed gap height between the semiconductor chip 110 and the substrate 100.

Conversely, if compressive stress is induced on the sensing element A, the second level signal causes the compensating elements B increase its volume. Accordingly, the compressive stress on the sensing element A is decreased. Therefore, the first level signal applied to the circuit pattern 104 is decreased, leading to the tensile stress applied to the compensating elements B also being decreased. As a result, the initially designed gap height between the semiconductor chip 110 and the substrate 100 is substantially maintained.

Therefore, a first level signal, communicated to the circuit pattern 104 according to a first stress applied to the sensing element A, and a second level signal, generated by processing of the first level signal by the circuit pattern 104, communicated to the compensating elements B to induce a second stress to the compensating elements B may be understood as having opposite polarities with similar magnitude. Further, the first stress and the second stress may be understood as opposite stresses in that if the first stress is a compressive stress, the second stress is a tensile stress, and vice versa.

In this way, in an embodiment of the present invention, the sensing element A and the compensating elements B use piezoelectric elements to minimize space variation between the semiconductor chip 110 and the substrate 100 through an automatic compensating procedure. As a consequence, a stress applied to the connection members 108 such as bumps may be decreased, by which the reliability of joints of the connection members 108 can be improved and the reliability of the semiconductor package 120 can be improved. While various embodiments of the invention refer to the semiconductor chip 110 and the substrate 100, the invention need not be so limited. For example, an embodiment of the invention may be used between two semiconductor chips 110 that are stacked vertically.

In the semiconductor package 120 in accordance with an embodiment of the present invention, since the distance maintaining members 106 function to ensure the mounting reliability of the substrate 100 and the semiconductor chip 110, the distance maintaining members 106 may replace the underfill process performed according to the conventional art to ensure mounting reliability. Accordingly, in various embodiments of the present invention, the manufacturing costs can be reduced through omission of the underfill process, and it may also be possible to solve problems caused due to deterioration of reliability resulting from the use of the underfill process.

In addition, in the various embodiments of the present invention, since it is not necessary to perform a process for forming a film or a non-conductive adhesive in place of the underfill process, it is possible to solve problems likely to be caused due to the use of the film or the non-conductive adhesive when transmitting electrical signals.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip including a semiconductor chip body having a first surface and a second surface that faces away from the first surface, and including a plurality of bonding pads disposed on the first surface, and a distance maintaining member attached to the first surface of the semiconductor chip body and electrically connected with a circuit pattern; and
a substrate having an upper surface, on which the semiconductor chip is mounted and is brought into contact with the distance maintaining member, and a lower surface that faces away from the upper surface;
wherein the distance maintaining member comprising:
a sensing element configured to sense a distance between the first surface of the semiconductor chip body and the upper surface of the substrate;
compensating elements configured to appropriately maintain the distance; and
connection members electrically connecting the bonding pads with at least a portion of the substrate.

2. The semiconductor package according to claim 1, wherein the compensating elements are disposed at positions adjacent to the sensing element.

3. The semiconductor package according to claim 1, wherein the distance maintaining member has a number of the compensating elements greater than a number of the sensing elements.

4. The semiconductor package according to claim 1, wherein the sensing element comprises a first piezoelectric element that is configured to generate a first level signal to communicate to the circuit pattern, wherein the first level signal is generated according to a first stress applied to the first piezoelectric element;
and the compensating elements comprise second piezoelectric elements configured to receive a second level signal generated by the circuit pattern based on the first level signal.

5. The semiconductor package according to claim 4, wherein the first level signal and the second level signal have opposite polarities and substantially the same magnitude.

6. The semiconductor package according to claim 1, wherein at least one distance maintaining member is attached to the first surface of the semiconductor chip body.

7. The semiconductor package according to claim 1, wherein the connection members have substantially the same height as the distance maintaining member which is formed on the first surface of the semiconductor chip body.

8. The semiconductor package according to claim 1, wherein the circuit pattern is formed in the semiconductor chip body and includes a circuitry for inverting and amplifying an input voltage.

* * * * *